United States Patent
Yoshimoto

(10) Patent No.: US 12,436,460 B2
(45) Date of Patent: Oct. 7, 2025

(54) LASER-ENGRAVABLE FLEXOGRAPHIC PRINTING ORIGINAL PLATE

(71) Applicant: TOYOBO CO., LTD., Osaka (JP)

(72) Inventor: Kazuya Yoshimoto, Okayama (JP)

(73) Assignee: TOYOBO MC CORPORATION, Osaka (JP)

( * ) Notice: Subject to any disclaimer, the term of this patent is extended or adjusted under 35 U.S.C. 154(b) by 635 days.

(21) Appl. No.: 17/790,036

(22) PCT Filed: Dec. 21, 2020

(86) PCT No.: PCT/JP2020/047627
§ 371 (c)(1),
(2) Date: Jun. 29, 2022

(87) PCT Pub. No.: WO2021/140895
PCT Pub. Date: Jul. 15, 2021

(65) Prior Publication Data
US 2022/0390842 A1    Dec. 8, 2022

(30) Foreign Application Priority Data
Jan. 7, 2020    (JP) ................. 2020-000642

(51) Int. Cl.
*G03F 7/032*    (2006.01)
*B41N 1/12*    (2006.01)

(52) U.S. Cl.
CPC ............. *G03F 7/032* (2013.01); *B41N 1/12* (2013.01)

(58) Field of Classification Search
None
See application file for complete search history.

(56) References Cited

U.S. PATENT DOCUMENTS

| | | | | |
|---|---|---|---|---|
| 5,063,137 A | * | 11/1991 | Kiyonari | B41M 5/267 430/311 |
| 2002/0015896 A1 | * | 2/2002 | Ohtaki | G03H 1/0248 430/1 |
| 2004/0241573 A1 | | 12/2004 | Ray et al. | |
| 2007/0160928 A1 | * | 7/2007 | Yamada | G03F 7/0755 430/270.1 |
| 2012/0251834 A1 | * | 10/2012 | Yoshimoto | B41N 1/003 428/447 |
| 2015/0336371 A1 | * | 11/2015 | Yawata | G03F 7/405 427/512 |

FOREIGN PATENT DOCUMENTS

| | | | |
|---|---|---|---|
| JP | 2003287887 A | * | 10/2003 |
| JP | 2005-254696 A | | 9/2005 |
| JP | 2014-209229 A | | 11/2014 |
| JP | 2016-71044 A | | 5/2016 |
| JP | 2018-120131 A | | 8/2018 |
| WO | 2007/116941 A1 | | 10/2007 |
| WO | 2011/081084 A1 | | 7/2011 |
| WO | 2014/157064 A1 | | 10/2014 |
| WO | 2020/105259 A1 | | 5/2020 |

OTHER PUBLICATIONS

Translated Description of Sasashita, K (Year: 2003).*
Notification of Transmittal of Copies of Translation of the International Preliminary Report on Patentability (Form PCT/IB/338) issued in counterpart International application No. PCT/JP2020/047627 mailed Jul. 21, 2022 with Forms PCT/IB/373 and PCT/ISA/237. (6 pages).
International Search Report dated Feb. 22, 2021, issued in counterpart Application No. PCT/JP2020/047627, with English translation. (7 pages).
Office Action dated Mar. 28, 2023, issued in counterpart CN Application No. 202080092033.7. (9 pages).

* cited by examiner

*Primary Examiner* — Jonathan Johnson
*Assistant Examiner* — Andrew Preston Traywick
(74) *Attorney, Agent, or Firm* — WHDA, LLP

(57) ABSTRACT

The present invention relates to a laser-engravable flexographic printing original plate in which an increase in time required for entire surface curing is suppressed while benefiting from a decrease in plate surface tackiness due to blending of the silicone compound. A laser-engravable flexographic printing original plate obtained by irradiating a molded product made of a photosensitive resin composition with light so as to cross-link and cure the molded product, in which the photosensitive resin composition contains a water-dispersible latex, a photopolymerizable unsaturated compound, a photopolymerization initiator, and a silicone compound having an amino group in the molecule. When the water-dispersible latex is selected from polybutadiene rubber and poly(nitrile-butadiene) rubber, the silicone compound has a refractive index of 1.44 to 1.60. When the water-dispersible latex is poly(styrene-butadiene) rubber, the silicone compound has a refractive index of 1.47 to 1.63.

7 Claims, No Drawings

LASER-ENGRAVABLE FLEXOGRAPHIC PRINTING ORIGINAL PLATE

TECHNICAL FIELD OF THE INVENTION

The present invention relates to a laser-engravable flexographic printing original plate in which a disadvantage of an increase in time required for production of a printing original plate due to blending of a silicone compound, particularly an increase in time required for entire surface curing (i.e. a process in which a photosensitive resin composition is irradiated with light, thereby the photosensitive resin composition is cross-linked and cured) is suppressed while benefiting from a decrease in plate surface tackiness due to blending of the silicone compound.

BACKGROUND ART

A laser-engravable flexographic printing original plate is generally obtained by irradiating a sheet-shaped molded product made of a photosensitive resin composition with light so as to cross-link and cure the sheet-shaped molded product. A printing plate is obtained by winding the sheet-shaped molded product around a cylindrical drum, continuously performing a laser engraving while rotating the drum, and then removing resin residues generated by the laser engraving from the plate surface. The photosensitive resin composition of this printing original plate generally contains a water-dispersible latex, a photopolymerizable unsaturated compound, and a photopolymerization initiator as essential components, and further contains additives such as a stabilizer and a plasticizer depending on necessity.

In a step of producing a printing plate from the printing original plate, the printing original plate is irradiated with a laser beam on the basis of image data so as to decompose and remove the irradiated portion, thereby forming concaves and convexes on the plate surface. At this time, resin residues are generated by decomposition of an image forming material of the portion irradiated with the laser beam. A part of the resin residues is scattered over the entire printing plate. A problem will occur in the printed matter if the resin residues are left on the printing plate. Therefore, the resin residues are removed from the printing plate by being sucked by a dust collector arranged in the vicinity of the laser device during the laser irradiation and/or by washing the printing plate after the laser irradiation.

However, there is a problem that the resin residues generated by laser irradiation do not tend to be removed even by the suction during the laser irradiation or the washing after the laser irradiation and tend to remain adhered to the plate. This is because the printing original plate generally contains a water-dispersible latex, which causes high tackiness of the original plate itself. If the resin residues remain adhered to the portion (convex portion) of the printing plate which has not been irradiated with the laser beam, there is a problem of printing defect. This is because this portion is a portion to which ink is applied at the time of printing. In addition, if the resin residues remain adhered to the bottom surface of the portion (concave portion) of the printing plate irradiated with the laser beam, depth of halftone dots decreases. Alternatively, if the resin residues remain adhered to the side surface of the concave portion, reproducibility of halftone dots decreases. Accordingly, in both cases, there is a fear of a decrease in resolution.

In order to overcome these problems, there has been proposed a photosensitive resin composition for a flexographic printing original plate in which a silicone compound having an amino group, an aryl group, or an aralkyl group is blended (cf. Patent Document 1).

By using the photosensitive resin composition of Patent Document 1, the tackiness of a printing original plate can be reduced due to the blending of the silicone compound, thereby the adhesion of resin residues generated at the time of laser irradiation to the plate surface can be suppressed to some extent. However, when the photosensitive resin composition is irradiated with light and cross-linked and cured thereby in the production of the printing original plate, scattering of irradiation light occurs due to the presence of the silicone compound. Accordingly, the time required for the entire surface curing of the photosensitive resin composition becomes significantly longer as compared with the case where the silicone compound is not blended, and thus the production efficiency of the printing original plate is poor. In particular, the time required for the entire surface curing tends to increase as the blending amount of the silicone compound in the photosensitive resin composition increases. Therefore, in the photosensitive resin composition of Patent Document 1, the blending amount of the silicone compound is limited to as small as 0.05 to 1.0% by mass, and thus it is difficult to sufficiently exhibit the plate surface tackiness-decreasing effect due to the silicone compound.

PRIOR ART DOCUMENT

Patent Document

Patent Document 1: WO 2007/116941

DISCLOSURE OF THE INVENTION

Problem that the Invention is to Solve

The present invention has been made in view of the above-described problems of the prior art. An object of the present invention is to provide a laser-engravable flexographic printing original plate in which the irradiation light can sufficiently reach the bottom even when the blending amount of the silicone compound in the photosensitive resin composition is increased in order to decrease the plate surface tackiness, and thus only a short time is required for curing the entire surface of the photosensitive resin composition.

Means for Solving the Problem

In order to achieve the above object, the present inventors have conducted intensive studies on the reason why the time required for entire surface curing increases when a silicone compound is blended in a photosensitive resin composition. As a result, the present inventors have found the following. There is a large difference between a refractive index of the water-dispersible latex in the photosensitive resin composition and a refractive index of a silicone compound that has been conventionally used. Therefore, irradiation light is greatly scattered when passing through the photosensitive resin composition. As a result of this light scattering, light cannot sufficiently reach the bottom of a molded product made of the photosensitive resin composition, resulting in an increase in the time required for entire surface curing. In particular, the present inventors have found that the time required for the entire surface curing becomes significantly longer when the thickness of the molded product made of the photosensitive resin composition becomes large. In order to solve this problem, the present inventors have found that by adjusting the refractive index of the silicone compound by, for example, introducing an appropriate amount of a group containing an aromatic ring into the silicone compound in such a way that the refractive index of the water-dispersible latex and the refractive index of the silicone compound approximate to each other, the scattering of irradiation light for cross-linking and curing is greatly reduced. Accordingly, the present inventors have found that even if the blending amount of the silicone compound is increased in order to enhance the plate surface tackiness-decreasing effect, the time required for entire surface curing does not increase.

The present invention has been completed based on the above findings and has the following configurations (1) to (7).

(1) A laser-engravable flexographic printing original plate obtained by irradiating a molded product made of a photosensitive resin composition with light so as to cross-link and cure the molded product, in which the photosensitive resin composition contains a water-dispersible latex, a photopolymerizable unsaturated compound, a photopolymerization initiator, and a silicone compound, in which the water-dispersible latex is one or more latex rubbers selected from the group consisting of polybutadiene rubber and poly(nitrile-butadiene) rubber, and in which the silicone compound is a silicone compound having an amino group in the molecule and has a refractive index of 1.44 to 1.60.

(2) A laser-engravable flexographic printing original plate obtained by irradiating a molded product made of a photosensitive resin composition with light so as to cross-link and cure the molded product, in which the photosensitive resin composition contains a water-dispersible latex, a photopolymerizable unsaturated compound, a photopolymerization initiator, and a silicone compound, in which the water-dispersible latex is poly (styrene-butadiene) rubber, and in which the silicone compound is a silicone compound having an amino group in the molecule and has a refractive index of 1.47 to 1.63.

(3) The laser-engravable flexographic printing original plate according to (1) or (2), in which the silicone compound is a silicone compound having an amino group and a group containing an aromatic ring in the molecule.

(4) The laser-engravable flexographic printing original plate according to (3), in which an amino group equivalent in the silicone compound is 500 to 10,000 g/mol and an equivalent of the group containing an aromatic ring in the silicone compound is 20 to 1,000 g/mol.

(5) The laser-engravable flexographic printing original plate according to any one of (1) to (4), in which a number average molecular weight of the silicone compound is 500 to 50,000.

(6) The laser-engravable flexographic printing original plate according to any one of (1) to (5), in which a content of the silicone compound in the photosensitive resin composition is more than 1.0% by mass and not more than 10% by mass.

(7) The laser-engravable flexographic printing original plate according to any one of (1) to (6), in which a thickness of the molded product made of the photosensitive resin composition is 2.0 mm to 5.0 mm.

Effects of the Invention

In the laser-engravable flexographic printing original plate of the present invention, a specific silicone compound is selected and adjusted in such a way that the difference in the refractive index for the irradiation light between the water-dispersible latex and the silicone compound in the photosensitive resin composition to be used becomes small. Accordingly, the scattering of the irradiation light for cross-linking and curing hardly occurs even if the blending amount of the silicone compound is increased in order to enhance the plate surface tackiness-decreasing effect. As a result, light can sufficiently reach the bottom of the photosensitive resin composition, and entire surface curing can be achieved in a short time. Consequently, it is possible to avoid an increase in time required for the entire surface curing of the photosensitive resin composition, and thus it is possible to efficiently print a large amount of high-quality printed matter.

BEST MODE FOR CARRYING OUT THE INVENTION

Hereinafter, the laser-engravable flexographic printing plate of the present invention will be described. The laser-engravable flexographic printing plate of the present invention is obtained by irradiating a molded product made of a photosensitive resin composition with light so as to cross-link and cure the molded product, wherein the photosensitive resin composition contains a water-dispersible latex, a photopolymerizable unsaturated compound, a photopolymerization initiator, and a silicone compound. In particular, the laser-engravable flexographic printing plate of the present invention is characterized in that a specific silicone compound is selected and adjusted in such a way that the difference in the refractive index for irradiation light between the water-dispersible latex and the silicone compound does not become large.

The water-dispersible latex is a hydrophobic polymer constituting a main component of the photosensitive resin composition. In the present invention, the water-dispersible latex is (i) one or more latex rubbers selected from the group consisting of polybutadiene rubber and poly(nitrile-butadiene) rubber or (ii) poly(styrene-butadiene) rubber. In the case of (i), either of polybutadiene rubber or poly(nitrile-butadiene) rubber may be used, but it is preferable to use both of these for high-quality printing with excellent fine image reproducibility. These water-dispersible latexes may be modified with (meth)acryl, carboxy, silicone, fluorine and the like if desired. As to the water-dispersible latex, a large number of various synthetic latexes and natural latexes are commercially available. Accordingly, desired one may be appropriately obtained from these.

An amount of the water-dispersible latex blended in the photosensitive resin composition is preferably 40% to 80% by mass. A strength as a printing plate may be insufficient when the amount is less than 40% by mass. It may take time for water development when the amount exceeds 80% by mass.

The photopolymerizable unsaturated compound is polymerized, cross-linked and cured by being irradiated with light so as to form a dense network for a shape maintenance of the printing original plate. Preferably, the photopolymerizable unsaturated compound contains a photopolymerizable oligomer. The photopolymerizable oligomer is a polymer in which an ethylenically unsaturated group is bonded to a terminal and/or side chain of a conjugated diene-based polymer and is preferably one having a number average molecular weight of 1000 to 10000.

The conjugated diene-based polymer is composed of a homopolymer of a conjugated diene unsaturated compound or a copolymer of a conjugated diene unsaturated compound and a monoethylenically unsaturated compound. Examples of such copolymers include butadiene polymer, isoprene polymer, chloroprene polymer, styrene-chloroprene copolymer, acrylonitrile-butadiene copolymer, acrylonitrile-isoprene copolymer, methyl methacrylate-isoprene copolymer, acrylonitrile-isoprene copolymer, methyl methacrylate-isoprene copolymer, methyl methacrylate-chloroprene copolymer, methyl acrylate-butadiene copolymer, methyl acrylate-isoprene copolymer, methyl acrylate-chloroprene copolymer, acrylonitrile-butadiene-styrene copolymer, and acrylonitrile-chloroprene-styrene copolymer. Among these, butadiene polymer, isoprene polymer, and acrylonitrile-butadiene copolymer are preferable, and butadiene polymer and isoprene polymer are especially preferable in terms of rubber elasticity and photocurability.

As to the photopolymerizable unsaturated compound, generally used photopolymerizable monomers such as meth-a(a)crylates can be used in addition to those exemplified above, as long as the effects of the present invention are not impaired. An amount of the photopolymerizable unsaturated compound blended in the photosensitive resin composition is preferably 10% to 45% by mass. A toughness may decrease when the amount of photopolymerizable unsaturated compound blended is less than 10% by mass. A developability may decrease when the content of photopolymerizable unsaturated compound exceeds 45% by mass.

The photopolymerization initiator is not particularly limited and a conventionally known one can be used as long as it can polymerize a polymerizable carbon-carbon unsaturated group with light. Among these, those having a function of generating radicals by autolysis or hydrogen abstraction by light absorption are preferably used. Specific examples thereof include benzoin alkyl ethers, benzophenones, anthraquinones, benzyls, acetophenones, and diacetyls. An amount of the photopolymerization initiator blended in the photosensitive resin composition is preferably 0.1% to 10% by mass. A starting efficiency may decrease and thus the image reproducibility may be poor when the amount of photopolymerization initiator blended is less than 0.1% by mass. A sensitivity may increase and thus it may be difficult to control a light irradiation time for entire surface curing when the amount of photopolymerization initiator blended exceeds 10% by mass.

The silicone compound has a role of decreasing plate surface tackiness of the printing plate and preventing adhesion of resin residues generated during the laser engraving. In addition to this, the silicone compound also has a role of preventing the printing plate surface from staining by its ink repellency. The silicone compound used in the present invention is required to be an amino-modified silicone compound having an amino group in the molecule. When the amino-modified silicone compound is used, the effect of preventing the plate surface from staining by the silicone compound can be sustainably exerted. It is considered that this is because the amino group in the molecule is added to the double bond in the photopolymerizable unsaturated compound by Michael reaction, the silicone compound is fixed in the printing plate, and a migration of the silicone compound during printing is blocked. A position of the amino group in the molecule is not limited, and examples thereof include a terminal position and a side chain position. A number of amino groups may be one or more, and the silicone compound may have amino groups at a plurality of sites. The silicone compound may have functional groups other than an amino group. Since the silicone compound fixed by the amino group is present in a dispersed state in the entire printing plate, it is considered that the ink repellency is maintained even if the surface of the printing plate is abraded by mass printing.

An amino group equivalent in the amino-modified silicone compound is preferably in a range of 500 g/mol to 10,000 g/mol and further preferably in a range of 1,000 g/mol to 5,000 g/mol. The initial ink repellent effect may be poor when the amino group equivalent is less than the lower limit. The effect sustainability may be poor when the amino group equivalent exceeds the upper limit.

A kinematic viscosity of the amino-modified silicone compound is not particularly limited but is preferably in a range of 20 to 5000 $mm^2$/s and further preferably in a range of 40 to 1000 $mm^2$/s. The plate surface tackiness-decreasing effect or ink repellency may be poor when the kinematic viscosity is less than the lower limit. A dissolution stability may be poor when the ink repellency exceeds the upper limit.

In the present invention, it is important to select a silicone compound having a refractive index in a specific range close to a refractive index of the water-dispersible latex contained in the photosensitive resin composition at the time of light irradiation. That is, when the type of the water-dispersible latex is changed, the above-described refractive index of the water-dispersible latex also changes. This is the reason why it is important to select in advance a silicone compound having a refractive index corresponding to the above change. Specifically, when the water-dispersible latex is one or more latex rubbers selected from the group consisting of polybutadiene rubber and polynitrile butadiene rubber (each having a refractive index of 1.52), it is necessary to select a silicone compound having a refractive index of 1.44 to 1.60, preferably 1.46 to 1.58, which is close to 1.52, in order to reduce the scattering of irradiation light. Alternatively, when the water-dispersible latex is poly(styrene-butadiene) rubber (having a refractive index of 1.55), it is necessary to select a silicone compound having a refractive index of 1.47 to 1.63, preferably 1.49 to 1.61, which is close to 1.55, in order to reduce the scattering of irradiation light. The aim of such selection is for suppressing the increase in the time required for entire surface curing due to the scattering of irradiation light used for cross-linking and curing of the photosensitive resin composition by controlling the refractive index of the silicone compound close to the refractive index of the water-dispersible latex. As described above, the refractive index of the water-dispersible latex is 1.52 for polybutadiene rubber and poly(nitrile-butadiene) rubber and 1.55 for poly(styrene-butadiene) rubber, whereas the refractive index of the silicone compound that has been conventionally used is considerably lower than the above values and is around 1.4. Due to such difference in refractive index, when the conventional silicone compound is blended in the photosensitive resin composition and mixed with the water-dispersible latex, light scattering occurs at an interface between the silicone compound and the water-dispersible latex, so that light cannot sufficiently reach the bottom of the molded product made of the photosensitive resin composition, and thus the time required for entire surface curing increases. This problem of the increase in the time required for entire surface curing is remarkable particularly when the thickness of the molded product made of the photosensitive resin composition is large. In the present invention, by increasing the refractive index of the silicone compound as compared with that of the conventional one so as to suppress the difference in refractive index between the silicone compound and the water-dispersible latex within a small range, the occurrence of light scattering at the interface between the silicone compound and the water-dispersible latex as described above is reduced, and as a result, the increase in the time required for entire surface curing is prevented. As described above, unlike the conventional silicone compound, the silicone compound used in the present invention does not increase the time required for entire surface curing even if it is blended in a large amount in the photosensitive resin composition. Accordingly, the production efficiency of the printing original plate is high. In addition, the plate surface tackiness-decreasing effect inherent in the silicone compound can be sufficiently exhibited.

The method for controlling the refractive index of the silicone compound within the above range is not particularly limited, and examples thereof include a method in which an appropriate amount of a group containing an aromatic ring is introduced into a silicone compound having an amino group in the molecule, thereby the refractive index of the silicone compound is led to a desired refractive index higher than the refractive index of the conventional silicone compound. A silicone compound in a conventional state in which an amino group is simply introduced has a low refractive index that is still greatly different from the refractive index of the water-dispersible latex. However, the refractive index of the silicone compound can be increased by introducing a bulky aromatic ring, thereby the difference in refractive index between the silicone compound and the water-dispersible latex can be minimized. The group containing an aromatic ring is not particularly limited but, for example, a bulky aromatic ring such as a phenyl group, a styryl group, a naphthyl group may be appropriately selected depending on the desired refractive index.

An equivalent of the group containing an aromatic ring in the silicone compound is preferably 20 to 1,000 g/mol and further preferably 50 to 500 g/mol. The plate surface tackiness-decreasing effect or ink repellency may be insufficient when the equivalent of the group containing an aromatic ring is less than the lower limit. The effect of increasing the refractive index may be insufficient and thus the light scattering may occur at the interface with the water-dispersible latex when the equivalent exceeds the upper limit.

The above-mentioned silicone compound having an amino group and a group containing an aromatic ring in the molecule and having a refractive index close to the refractive index of the water-dispersible latex may be produced by a conventionally known method. Alternatively, for example, the following products commercially available from the market may be used. Examples of such products include X22 1660B-3 and X22 9409 manufactured by Shin-Etsu Chemical Co., Ltd. In case one wishes to prepare the silicone compound instead of using the commercial products, one can synthesize the silicone compound, for example, by appropriately using a conventionally known synthesis method disclosed in Japanese Patent Application Laid-Open (JP-A) No. 197486/91, Japanese Patent Application Laid-Open (JP-A) No. 34855/96, Japanese Patent Application Laid-Open (JP-A) No. 2006-213856, and Japanese Patent Application Laid-Open (JP-A) No. 2017-52737.

A number average molecular weight of the silicone compound used in the present invention is preferably 500 to 50,000 and more preferably 1,000 to 10,000. The plate surface tackiness-decreasing effect or ink repellency may be insufficient when the number average molecular weight is less than the lower limit. A compatibility with the photosensitive resin may decrease when the number average molecular weight exceeds the upper limit.

In the printing original plate of the present invention, a content of the silicone compound in the photosensitive resin composition is preferably more than 1.0% by mass and not more than 10% by mass and more preferably 1.2% to 5.0% by mass. The plate surface tackiness-decreasing effect or the effect of preventing the plate surface from staining by the ink repellency of silicone compound may not be sufficiently exerted when the content of silicone compound is less than the lower limit. A mechanical strength of the printing plate may decrease when the content exceeds the upper limit. In the present invention, the occurrence of light scattering and the increase in the time required for entire surface curing caused thereby are prevented by matching the refractive index of silicone compound with the refractive index of the water-dispersible latex, as explained above. Accordingly, the silicone compound can be blended in an amount sufficient to exert a high level of the plate surface tackiness-decreasing effect that is required to realize high-quality mass printing.

In addition to the above components, a hydrophilic polymer can be added to the photosensitive resin composition which is a raw material of the printing original plate of the present invention. As to the hydrophilic polymer, those having a hydrophilic group such as —COOH, —COOM (M is a monovalent, divalent or trivalent metal ion or substituted or unsubstituted ammonium ion), —OH, —$NH_2$, —$SO_3H$, and a phosphoric acid ester group are preferable. Specific examples thereof include a polymer of (meth)acrylic acid or a salt thereof, a copolymer of (meth)acrylic acid or a salt thereof and an alkyl (meth)acrylate, a copolymer of (meth)acrylic acid or a salt thereof and a styrene, a copolymer of (meth)acrylic acid or a salt thereof and a vinyl acetate, a copolymer of (meth)acrylic acid or a salt thereof and an acrylonitrile, polyvinyl alcohol, carboxymethyl cellulose, polyacrylamide, hydroxyethyl cellulose, polyethylene oxide, polyethyleneimine, polyurethane having a —COOM group, polyureaurethane having a —COOM group, and polyamic acids having a —COOM group and salts or derivatives thereof. An amount of the hydrophilic polymer blended in the photosensitive resin composition is preferably 2% to 30% by mass. A developability may decrease when the amount of hydrophilic polymer blended is less than 2% by mass. A water resistance of relief may decrease when the amount of hydrophilic polymer blended exceeds 30% by mass.

In addition, a thermal polymerization inhibitor (stabilizer) can be added to the photosensitive resin composition from the viewpoints of enhancing thermal stability at the time of kneading and storage stability, and the like. An amount of the thermal polymerization inhibitor (stabilizer) blended in the photosensitive resin composition is generally 0.001% to 5% by mass. Examples of the thermal polymerization inhibitor include phenols, hydroquinones, and catechols.

Further, other components such as plasticizers, UV absorbers, dyes, pigments, defoamers, anti-aggregation agents, and fluorine compounds can be appropriately added to the photosensitive resin composition for the purpose of improving various properties, as long as the effects of the present invention are not impaired.

The photosensitive resin composition can be prepared by mixing the above-described essential components and optional components. At that time, an organic solvent such as toluene may be added as desired so as to facilitate the mixing. In order to completely mix the components, it is desirable to sufficiently knead the mixture under a heating condition using a kneader. The heating condition is preferably about 50 to 110° C. In addition, it is preferable to remove moisture contained in the components and in the organic solvent added at the time of mixing, under a reduced pressure after the kneading.

The laser-engravable printing original plate of the present invention is obtained by molding the photosensitive resin composition prepared as described above into a sheet shape or a cylindrical shape and then irradiating the molded product with light so as to crosslink and cure the molded product.

As to a method for molding the photosensitive resin composition into a sheet shape or a cylindrical shape, a conventionally known resin molding method can be used. Examples thereof include a method in which the photosensitive resin composition is applied onto an appropriate support or a cylinder of a printing machine and pressurized with a heat press machine or the like. The thickness of the molded product is preferably 2.0 to 5.0 mm and further preferably 2.5 to 4.0 mm from the viewpoint of shape retention and handleability. As to the support, a material having flexibility and excellent dimensional stability is preferably used. Examples thereof include a polyethylene terephthalate film, a polyethylene naphthalate film, a polybutylene terephthalate film, and polycarbonate. The thickness of the support is preferably 50 to 250 μm and further preferably 100 to 200 μm from the viewpoint of mechanical properties, shape stability, and the like of the printing original plate. In addition, if necessary, in order to improve adhesion between the support and the resin layer, a known adhesive conventionally used for this type of purpose may be provided on the surface. The pressurization condition is preferably about 20 to 200 kg/cm$^2$. The temperature condition at the time of pressurization is preferably about room temperature to 150° C.

Subsequently, the molded product made of the photosensitive resin composition is irradiated with light so as to crosslink and cure the photopolymerizable unsaturated compound in the resin composition, thereby obtaining a printing original plate. In the photosensitive resin composition of the present invention, due to small scattering of irradiation light, the time required for curing the entire surface of the resin composition is shorter than that using a conventional silicone compound. Examples of the light source used for curing include a high-pressure mercury lamp, an ultra-high-pressure mercury lamp, an ultraviolet fluorescent lamp, a carbon arc lamp, and a xenon lamp. The light source used for curing may be one type, but curing may be performed using two or more types of light sources having different wavelengths.

The printing original plate thus obtained is attached to the surface of a plate mounting drum of a laser engraving apparatus, and the irradiated portion of the original plate is decomposed by a laser irradiation according to the image so as to form a concave portion, thereby producing the printing plate. In the photosensitive resin composition of the present invention, a much more amount of silicone compound can be used than the conventional photosensitive resin composition, without increasing the time required for entire surface curing. Accordingly, the plate surface tackiness is effectively suppressed, and the resin residues decomposed by the laser irradiation can be extremely easily removed from the printing plate.

EXAMPLES

As hereunder, the effects of the present invention will be illustrated by referring to Examples although the present invention is not limited to those Examples. A term "part(s)" in Examples stand(s) for part(s) by mass, and values shown in Tables which indicate a composition ratio also stand for part(s) by mass.

Example 1

Preparation of Photosensitive Resin Composition

A dope was prepared by mixing, in a container, 76 parts by mass of butadiene latex (Nipol LX111NF manufactured by ZEON CORPORATION, non-volatile components: 55%) and 17 parts by mass of acrylonitrile-butadiene latex (Nipol SX1503 manufactured by ZEON CORPORATION, non-volatile components: 42%) as water-dispersible latex, 19 parts by mass of oligo(butadiene acrylate) (ABU-4S manufactured by KYOEISHA CHEMICAL CO., LTD.), 7.5 parts by mass of lauryl methacrylate (LIGHT ESTER L manufactured by KYOEISHA CHEMICAL CO., LTD.), and 7.5 parts by mass of trimethylolpropane triacrylate (LIGHT ESTER TMP manufactured by KYOEISHA CHEMICAL CO., LTD.) as photopolymerizable unsaturated compounds, 1 part by mass of photopolymerization initiator (Irgacure 651), 1 part by mass of silicone compound (X22 1660B-3 manufactured by Shin-Etsu Chemical Co., Ltd.), and 20 parts by mass of hydrophilic polymer (PFT-3 manufactured by KYOEISHA CHEMICAL CO., LTD., non-volatile components: 25%), 9.9 parts by mass of butadiene oligomer (B2000 manufactured by NIPPON SODA CO., LTD.), and 0.1 part by mass of a heat stabilizer (4-methoxyphenol) as other components. The dope was put into a pressurized kneader, and toluene and water were removed therefrom under a reduced pressure at 80° C. so as to obtain a photosensitive resin composition. The silicone compound used in this Example was a silicone compound having an amino group and a phenyl group in the molecule. The refractive index thereof was 1.50, the amino group equivalent was 2200 g/mol, the molar ratio of diphenylsiloxane unit/dimethylsiloxane unit was 27/73, the phenyl group equivalent was 210 g/mol, and the number average molecular weight was 4400. In each of Examples and Comparative Examples, the refractive index was measured using a hand-held refractometer manufactured by ATAGO CO., LTD. The refractive index was measured at 25° C. using the D line of sodium spectrum as light rays.

Preparation of Laser-Engravable Flexographic Printing Original Plate

Next, this photosensitive resin composition was sandwiched between a film obtained by coating a polyethylene terephthalate film having a thickness of 125 μm with a polyester-based adhesive layer and a film obtained by coating a polyethylene terephthalate film having a thickness of 125 μm with an anti-tack layer (polyvinyl alcohol) (so that the adhesive layer and the anti-tack layer are in contact with the resin composition), and the product was pressed with a heat press machine at 105° C. and a pressure of 100 kg/cm$^2$ for 1 minute so as to provide a sheet-shaped molded product having a thickness of 2.5 mm. Next, the sheet-shaped molded product was exposed to light at 8 mW/cm$^2$ for 10 minutes from one side with an ultraviolet exposure machine arranged at a height of 5 cm above the side, and the entire surface was cured by cross-linking so as to produce a laser-engravable flexographic printing original plate. The exposure time was determined according to the evaluation procedure of "time required for entire surface curing" described later.

Production of Printing Plate

Next, this printing original plate was wound around a plate mounting drum of a laser engraving apparatus with a double-sided tape, and laser engraving was performed under the following conditions. Simultaneously with the start of the laser engraving, a dust collector installed in the vicinity of the laser gun was operated so as to continuously discharge the engraved resin residues to the outside of the apparatus. After the laser engraving, the plate was removed from the mounting drum, and was washed with water for 3 minutes using a water developing plate-dedicated washing machine (CRS600 manufactured by Toyobo Co., Ltd., developer: 1% washing soap aqueous solution, water temperature: 40° C.) so as to remove a small amount of resin residues adhering to the plate surface and dried so as to obtain a printing plate.

As to the laser engraving apparatus, "FlexPose! Direct" equipped with a 300 W carbon dioxide laser manufactured by Luescher Flexo was used. The specifications of this apparatus were a laser wavelength of 10.6 μm, a beam diameter of 30 μm, a plate mounting drum diameter of 300 mm, and a processing speed of 1.5 hours/0.5 m². The laser engraving conditions were as follows. Note that conditions (1) to (3) are conditions unique to the apparatus. Conditions (4) to (7) can be arbitrarily set, and the standard conditions of this apparatus are adopted for each condition.
  (1) Resolution: 2,540 dpi
  (2) Laser pitch: 10 μm
  (3) Drum rotation speed: 982 cm/sec
  (4) Top power: 9%
  (5) Bottom power: 100%
  (6) Shoulder width: 0.30 mm
  (7) Relief depth: 0.60 mm
  (8) Evaluation image: 175 lpi, halftone dots of 0 to 100% in increments of 1%

Examples 2 to 16 and Comparative Examples 1 to 9

Photosensitive resin compositions, laser-engravable flexographic printing original plates, and printing plates were prepared in the same manner as in Example 1 except that the composition of the photosensitive resin composition (which is a raw material in the printing original plate) was changed as presented in Table 1 or Table 2.

Methods for synthesizing the silicone compound of Synthesis Example 1 to the silicone compound of Synthesis Example 4 in Table 1 were as follows.

As to a synthetic raw material, the following side chain phenyl group-modified dimethylsiloxane having a hydroxy group at a terminal was prepared.
  A-1: Organopolysiloxane having terminal OH, number average molecular weight of about 2100, and diphenylsiloxane unit/dimethylsiloxane unit=37/63 (molar ratio)
  A-2: Organopolysiloxane having terminal OH, number average molecular weight of about 2000, and diphenylsiloxane unit/dimethylsiloxane unit=17/83 (molar ratio)
  A-3: Organopolysiloxane having terminal OH, number average molecular weight of about 2100, and diphenylsiloxane unit/dimethylsiloxane unit=29/71 (molar ratio)
  A-4: Organopolysiloxane having terminal OH, number average molecular weight of about 8000, and diphenylsiloxane unit/dimethylsiloxane unit=30/70 (molar ratio)

(Silicone Compound of Synthesis Example 1)

An amino group was introduced into a terminal of the prepared synthetic raw material A-1 so as to obtain a silicone compound having an amino group and a phenyl group in the molecule. Specifically, 0.1 mol of the prepared synthetic raw material A-1 and 0.2 mol of N-β-(aminoethyl)-γ-aminopropylmethyldimethoxysilane were charged in a 1,000 ml glass flask equipped with an ester adapter, a condenser, and a thermometer, and the first-stage condensation reaction was conducted at 120° C. for 3 hours under nitrogen aeration. Distillation of methanol due to the reaction for methanol removal was observed in the ester adapter. After completion of the reaction, the obtained product was structurally identified by $^{29}$Si-NMR. As a result, the peak (−2.7 ppm) of N-β-(aminoethyl)-γ-aminopropylmethyldimethoxysilane that was a raw material disappeared and thus all the silanes were involved in the reaction. The obtained product was a silicone compound having an amino group and a phenyl group in the molecule. The refractive index thereof was 1.56, the amino group equivalent was 1250 g/mol, the phenyl group equivalent was 190 g/mol, and the number average molecular weight was 2500.

(Silicone Compound of Synthesis Example 2)

A silicone compound having an amino group and a phenyl group in the molecule was obtained by the same synthesis method as in Synthesis Example 1 except that the synthetic raw material was changed from A-1 to A-2. The obtained product was a silicone compound having an amino group and a phenyl group in the molecule. The refractive index thereof was 1.47, the amino group equivalent was 1200 g/mol, the phenyl group equivalent was 340 g/mol, and the number average molecular weight was 2400.

(Silicone Compound of Synthesis Example 3)

A silicone compound having an amino group and a phenyl group in the molecule was obtained by the same synthesis method as in Synthesis Example 1 except that the synthetic raw material was changed from A-1 to A-3. The obtained product was a silicone compound having an amino group and a phenyl group in the molecule. The refractive index thereof was 1.50, the amino group equivalent was 1250 g/mol, the phenyl group equivalent was 230 g/mol, and the number average molecular weight was 2500.

(Silicone Compound of Synthesis Example 4)

A silicone compound having an amino group and a phenyl group in the molecule was obtained by the same synthesis method as in Synthesis Example 1 except that the synthetic raw material was changed from A-1 to A-4. The obtained product was a silicone compound having an amino group and a phenyl group in the molecule. The refractive index thereof was 1.50, the amino group equivalent was 4200 g/mol, the phenyl group equivalent was 190 g/mol, and the number average molecular weight was 8400.

The light scattering property, time required for entire surface curing, degree of adhesion of resin residues (plate surface tackiness), halftone dot shape, halftone dot formability, ink laydown, and printing durability of the printing original plates or the printing plates of Examples 1 to 16 and Comparative Examples 1 to 9 were evaluated by the following procedures. The results are presented in Table 1 and Table 2, respectively.

Details of the water-dispersible latexes and silicone compounds in Table 1 and Table 2 are as follows.

(Water-Dispersible Latexes)
  Polybutadiene rubber 1: Butadiene latex (Nipol LX111NF manufactured by ZEON CORPORATION, non-volatile components: 55%)
  Poly (nitrile-butadiene) rubber: Acrylonitrile-butadiene latex (Nipol SX1503 manufactured by ZEON CORPORATION, non-volatile components: 42%)
  Poly (styrene-butadiene) rubber 1: Styrene-butadiene latex (Nipol LX432A manufactured by ZEON CORPORATION, non-volatile components: 41%)
  Polybutadiene rubber 2: Polybutadiene rubber (Nipol BR1241 manufactured by ZEON CORPORATION)

Poly (styrene-butadiene) rubber 2: Styrene-butadiene rubber by solution polymerization (Nipol NS112R manufactured by ZEON CORPORATION)

(Silicone Compounds)

X22 1660B-3: Silicone compound having an amino group and a phenyl group in the molecule. Refractive index: 1.50, amino group equivalent: 2200 g/mol, phenyl group equivalent: 210 g/mol, number average molecular weight: 4400, manufactured by Shin-Etsu Chemical Co., Ltd.

Silicone compound of Synthesis Example 1: Silicone compound having an amino group and a phenyl group in the molecule. Refractive index: 1.56, amino group equivalent: 1250 g/mol, phenyl group equivalent: 190 g/mol, number average molecular weight: 2500.

Silicone compound of Synthesis Example 2: Silicone compound having an amino group and a phenyl group in the molecule. Refractive index: 1.47, amino group equivalent: 1200 g/mol, phenyl group equivalent: 340 g/mol, number average molecular weight: 2400.

Silicone compound of Synthesis Example 3: Silicone compound having an amino group and a phenyl group in the molecule. Refractive index: 1.50, amino group equivalent: 1250 g/mol, phenyl group equivalent: 230 g/mol, number average molecular weight: 2500.

Silicone compound of Synthesis Example 4: Silicone compound having an amino group and a phenyl group in the molecule. Refractive index: 1.50, amino group equivalent: 4200 g/mol, phenyl group equivalent: 190 g/mol, number average molecular weight: 8400.

KF8012: Silicone compound having an amino group in the molecule. Refractive index: 1.41, amino group equivalent: 2200 g/mol, manufactured by Shin-Etsu Chemical Co., Ltd.

KF-1005: Silicone compound having an epoxy-aralkyl group in the molecule. Refractive index: 1.48, manufactured by Shin-Etsu Chemical Co., Ltd.

KF50-300: Silicone compound having a phenyl group in the molecule. Refractive index: 1.49, manufactured by Shin-Etsu Chemical Co., Ltd.

KF96-500: Unmodified silicone compound. Refractive index: 1.40, manufactured by Shin-Etsu Chemical Co., Ltd.

(1) Light Scattering Property

The photosensitive resin composition prepared in each of Examples and Comparative Examples was sandwiched between PET films and pressed so as to have a film thickness of 0.25 mm. Next, the front of the pressed product was irradiated with actinic rays (illuminance at 365 nm: 8 mW/cm$^2$) for a time required for entire surface curing so as to prepare a sample for measurement of the light scattering property. With regard to this sample, a light scattering rate of the photosensitive resin composition at λ=365 nm was measured using a spectrophotometer (U-3210 manufactured by Hitachi, Ltd. with 1509 integrating sphere accessory). The light scattering property was judged according to the following criteria. When the light scattering rate is 20% or less: ⊙, when the light scattering rate is larger than 20% and 40% or less: ○, when the light scattering rate is larger than 40% and 60% or less: Δ, and when the light scattering rate is larger than 60%: x (2) Time Required for Entire Surface Curing The photosensitive resin composition produced in each of the examples and comparative examples was sandwiched between two polyethylene terephthalate films having a thickness of 125 μm and pressed with a heat press machine at 105° C. and a pressure of 100 kg/cm$^2$ for 1 minute so as to produce a sheet-shaped molded product having a thickness of 2.50 mm. Next, the obtained sample for surface hardness measurement was exposed to light at 8 mW/cm$^2$ for 10 minutes from one side (ultraviolet irradiated side) with an ultraviolet exposure machine arranged at a height of 5 cm above the side. Then, the polyethylene terephthalate films were peeled off and removed. Then, the resin hardness on a side opposite to the ultraviolet irradiated side was measured. If the measurement shows that the difference in resin hardness between the ultraviolet irradiation surface and the opposite surface was not less than 5, the ultraviolet irradiation was further continued. The ultraviolet irradiation time when the difference in resin hardness between the ultraviolet irradiation surface and the opposite surface became less than 5 was defined as the time required for the entire surface curing. In the measurement of the resin hardness, the Shore A hardness of the surface of the entire exposed portion of each sample was measured at room temperature (25° C.) using a Shore type durometer (Shore A type) manufactured by ZwickRoell. The hardness was measured at 10 locations, and the average value was taken as the value of surface hardness.

(3) Degree of Adhesion of Resin Residues (Plate Surface Tackiness)

Using a microscope with a magnification of 100 times, the degree of adhesion of resin residues to the surface of the printing plate was visually inspected and indicated in the following 4 grades.

⊙: almost no adhesion, ○: slight adhesion, Δ: considerable adhesion, and x: severe adhesion (4) Halftone Dot Shape The 10% halftone dot shape at 175 lpi was observed using a microscope with a magnification of 100 times.

○: The shape of halftone dots is reproduced in a conical shape without any chips or dents.

Δ: The shape of halftone dots has chips or dents and is partially unclear.

x: The shape of halftone dots has many chips or dents and is unclear.

(5) Halftone Dot Formability

A microscope with a magnification of 100 times was used so as to measure 150 lpi minimum halftone dot formability and 175 lpi minimum halftone dot formability.

(6) Ink Laydown

Printing was performed using a flexographic printing machine, and the ink laydown to the surface of the printing plate was observed using a microscope with a magnification of 100 times.

○: no blur portions, Δ: slight blur portions observed, and x: blur portions observed (7) Printing Durability Printing was performed using a flexographic printing machine, and the relief was observed at a magnification of 30 times with a magnifying glass every time printing of 1,000 copies was completed. The number of copies printed before cracking occurred in the relief was defined as the printable number of copies.

○: The printable number of copies exceeds 1 million.

Δ: The printable number of copies is 100,000 or more and less than 1 million.

x: The printable number of copies is less than 100,000.

TABLE 1

| | | | Examples | | | |
|---|---|---|---|---|---|---|
| | | | 1 | 2 | 3 | 4 |
| Composition of photosensitive resin layer | water-dispersible latex | polybutadiene rubber 1 | 42.0 | 42.0 | 42.0 | 42.0 |
| | | poly(nitrile-butadiene) rubber | 7.0 | 7.0 | 7.0 | 7.0 |
| | | poly(styrene-butadiene) rubber 1 | | | | |
| | | polybutadiene rubber 2 | | | | |
| | | poly(styrene-butadiene) rubber 2 | | | | |
| | photopolymerizable unsaturated compound | oligo(butadiene acrylate) | 19.0 | 19.0 | 19.0 | 19.0 |
| | | lauryl methacrylate | 7.5 | 7.5 | 7.5 | 7.5 |
| | | trimethylolpropane triacrylate | 7.5 | 7.5 | 7.5 | 7.5 |
| | photopolymerization initiator | Irgacure 651 | 1.0 | 1.0 | 1.0 | 1.0 |
| | hydrophilic polymer | PFT-3 | 5.0 | 5.0 | 5.0 | 5.0 |
| | plasticizer | butadiene oligomer | 9.9 | 10.7 | 7.9 | 5.9 |
| | heat stabilizer | 4-methoxyphenol | 0.1 | 0.1 | 0.1 | 0.1 |
| | silicone compound | X22 1660B-3 | 1.0 | 0.2 | 3.0 | 5.0 |
| | | silicone compound of Synthesis Example 1 | | | | |
| | | silicone compound of Synthesis Example 2 | | | | |
| | | silicone compound of Synthesis Example 3 | | | | |
| | | silicone compound of Synthesis Example 4 | | | | |
| Evaluation | | light scattering property | ○○ | ○○ | ○○ | ○○ |
| | | time required for entire surface curing | 10 min. | 10 min. | 10 min. | 10 min. |
| | laser engraving property | degree of adhesion of resin residues (plate surface tackiness) | ○○ | ○○ | ○○ | ○○ |
| | | halftone dot shape | ○ | ○ | ○ | ○ |
| | | 150 lpi, halftone dot formability | 1% | 1% | 1% | 1% |
| | | 175 lpi, halftone dot formability | 1% | 1% | 1% | 1% |
| | printability | ink laydown | ○ | ○ | ○ | ○ |
| | | printing durability | ○ | ○ | ○ | ○ |

| | | | Examples | | | |
|---|---|---|---|---|---|---|
| | | | 5 | 6 | 7 | 8 |
| Composition of photosensitive resin layer | water-dispersible latex | polybutadiene rubber 1 | 42.0 | 42.0 | 42.0 | 42.0 |
| | | poly(nitrile-butadiene) rubber | 7.0 | 7.0 | 7.0 | 7.0 |
| | | poly(styrene-butadiene) rubber 1 | | | | |
| | | polybutadiene rubber 2 | | | | |
| | | poly(styrene-butadiene) rubber 2 | | | | |
| | photopolymerizable unsaturated compound | oligo(butadiene acrylate) | 19.0 | 19.0 | 19.0 | 19.0 |
| | | lauryl methacrylate | 7.5 | 7.5 | 7.5 | 7.5 |
| | | trimethylolpropane triacrylate | 7.5 | 7.5 | 7.5 | 7.5 |
| | photopolymerization initiator | Irgacure 651 | 1.0 | 1.0 | 1.0 | 1.0 |
| | hydrophilic polymer | PFT-3 | 5.0 | 5.0 | 5.0 | 5.0 |
| | plasticizer | butadiene oligomer | 3.9 | 7.9 | 7.9 | 7.9 |
| | heat stabilizer | 4-methoxyphenol | 0.1 | 0.1 | 0.1 | 0.1 |
| | silicone compound | X22 1660B-3 | 7.0 | | | |
| | | silicone compound of Synthesis Example 1 | | 3.0 | | |
| | | silicone compound of Synthesis Example 2 | | | 3.0 | |
| | | silicone compound of Synthesis Example 3 | | | | 3.0 |
| | | silicone compound of Synthesis Example 4 | | | | |
| Evaluation | | light scattering property | ○ | ○○ | ○ | ○○ |
| | | time required for entire surface curing | 12 min. | 10 min. | 12 min. | 10 min. |
| | laser engraving property | degree of adhesion of resin residues (plate surface tackiness) | ○○ | ○○ | ○○ | ○○ |
| | | halftone dot shape | ○ | ○ | ○ | ○ |
| | | 150 lpi, halftone dot formability | 1% | 1% | 1% | 1% |
| | | 175 lpi, halftone dot formability | 1% | 1% | 1% | 1% |
| | printability | ink laydown | ○ | ○ | ○ | ○ |
| | | printing durability | ○ | ○ | ○ | ○ |

| | | | Examples | | | |
|---|---|---|---|---|---|---|
| | | | 9 | 10 | 11 | 12 |
| Composition of photosensitive resin layer | water-dispersible latex | polybutadiene rubber 1 | 42.0 | 38.0 | 42.0 | 11.0 |
| | | poly(nitrile-butadiene) rubber | 7.0 | 11.0 | 7.0 | |
| | | poly(styrene-butadiene) rubber 1 | | | | 38.0 |
| | | polybutadiene rubber 2 | | | | |
| | | poly(styrene-butadiene) rubber 2 | | | | |
| | photopolymerizable unsaturated compound | oligo(butadiene acrylate) | 19.0 | 19.0 | 19.9 | 19.0 |
| | | lauryl methacrylate | 7.5 | 7.5 | 8.0 | 7.5 |
| | | trimethylolpropane triacrylate | 7.5 | 7.5 | 8.0 | 7.5 |
| | photopolymerization initiator | Irgacure 651 | 1.0 | 1.0 | 1.0 | 1.0 |
| | hydrophilic polymer | PFT-3 | 5.0 | 5.0 | 0.0 | 5.0 |
| | plasticizer | butadiene oligomer | 7.9 | 7.9 | 11 | 7.9 |
| | heat stabilizer | 4-methoxyphenol | 0.1 | 0.1 | 0.1 | 0.1 |

TABLE 1-continued

| | | | | | | |
|---|---|---|---|---|---|---|
| | silicone compound | X22 1660B-3 | | 3.0 | 3.0 | 3.0 |
| | | silicone compound of Synthesis Example 1 | | | | |
| | | silicone compound of Synthesis Example 2 | | | | |
| | | silicone compound of Synthesis Example 3 | | | | |
| | | silicone compound of Synthesis Example 4 | 3.0 | | | |
| Evaluation | | light scattering property | ○○ | ○○ | ○○ | ○○ |
| | | time required for entire surface curing | 10 min. | 10 min. | 10 min. | 10 min. |
| | laser engraving property | degree of adhesion of resin residues (plate surface tackiness) | ○○ | ○○ | ○○ | ○○ |
| | | halftone dot shape | ○ | ○ | ○ | ○ |
| | | 150 lpi, halftone dot formability | 1% | 1% | 1% | 1% |
| | | 175 lpi, halftone dot formability | 1% | 1% | 1% | 1% |
| | printability | ink laydown | ○ | ○ | ○ | ○ |
| | | printing durability | ○ | ○ | ○ | ○ |

| | | | Examples | | | |
|---|---|---|---|---|---|---|
| | | | 13 | 14 | 15 | 16 |
| Composition of photosensitive resin layer | water-dispersible latex | polybutadiene rubber 1 | 39.0 | | 42.0 | 38.0 |
| | | poly(nitrile-butadiene) rubber | 6.0 | | 7.0 | 6.0 |
| | | poly(styrene-butadiene) rubber 1 | | 39 | | |
| | | polybutadiene rubber 2 | 4.0 | | | |
| | | poly(styrene-butadiene) rubber 2 | | 4.0 | | |
| | photopolymerizable unsaturated compound | oligo(butadiene acrylate) | 19.0 | 19.0 | 19.0 | 17.0 |
| | | lauryl methacrylate | 7.5 | 7.5 | 7.5 | 6.5 |
| | | trimethylolpropane triacrylate | 7.5 | 7.5 | 7.5 | 6.5 |
| | photopolymerization initiator | Irgacure 651 | 1.0 | 1.0 | 1.0 | 1.0 |
| | hydrophilic polymer | PFT-3 | 5.0 | 9.0 | 5.0 | 5.0 |
| | plasticizer | butadiene oligomer | 7.9 | 9.9 | 10.8 | 4.9 |
| | heat stabilizer | 4-methoxyphenol | 0.1 | 0.1 | 0.1 | 0.1 |
| | silicone compound | X22 1660B-3 | 3.0 | 3.0 | 0.05 | 15 |
| | | silicone compound of Synthesis Example 1 | | | | |
| | | silicone compound of Synthesis Example 2 | | | | |
| | | silicone compound of Synthesis Example 3 | | | | |
| | | silicone compound of Synthesis Example 4 | | | | |
| Evaluation | | light scattering property | ○○ | ○ | ○○ | Δ |
| | | time required for entire surface curing | 10 min. | 12 min. | 10 min. | 12 min. |
| | laser engraving property | degree of adhesion of resin residues (plate surface tackiness) | ○○ | ○○ | ○○ | ○○ |
| | | halftone dot shape | ○ | ○ | ○ | ○ |
| | | 150 lpi, halftone dot formability | 1% | 1% | 1% | 1% |
| | | 175 lpi, halftone dot formability | 1% | 1% | 1% | 1% |
| | printability | ink laydown | ○ | ○ | ○ | ○ |
| | | printing durability | ○ | ○ | ○ | ○ |

TABLE 2

| | | | Comparative Examples | | | | |
|---|---|---|---|---|---|---|---|
| | | | 1 | 2 | 3 | 4 | 5 |
| Composition of photosensitive resin layer | water-dispersible latex | polybutadiene rubber 1 | 42.0 | 42.0 | 42.0 | 42.0 | 44.0 |
| | | poly(nitrile-butadiene) rubber | 7.0 | 7.0 | 7.0 | 7.0 | 10.0 |
| | | poly(styrene-butadiene) rubber 1 | | | | | |
| | | polybutadiene rubber 2 | | | | | |
| | | poly(styrene-butadiene) rubber 2 | | | | | |
| | photopolymerizable unsaturated compound | oligo(butadiene acrylate) | 19.0 | 19.0 | 19.0 | 19.0 | 19.0 |
| | | lauryl methacrylate | 7.5 | 7.5 | 7.5 | 7.5 | 7.5 |
| | | trimethylolpropane triacrylate | 7.5 | 7.5 | 7.5 | 7.5 | 7.5 |
| | photopolymerization initiator | Irgacure 651 | 1.0 | 1.0 | 1.0 | 1.0 | 1.0 |
| | hydrophilic polymer | PFT-3 | 5.0 | 5.0 | 5.0 | 5.0 | 5.0 |
| | plasticizer | butadiene oligomer | 5.9 | 5.9 | 5.9 | 5.9 | 5.9 |
| | heat stabilizer | 4-methoxyphenol | 0.1 | 0.1 | 0.1 | 0.1 | 0.1 |
| | silicone compound | X22 1660B-3 | | | | | |
| | | amino-modified silicone compound (KF8012) | | 5 | | | |
| | | epoxy-modified silicone compound (KF1005) | | | 5 | | |
| | | phenyl-modified silicone compound (KF50-300) | | | | 5 | |
| | | unmodified silicone compound (KF96-500) | 5 | | | | |
| Evaluation | | light scattering property | x | x | ○ | ○○ | ○○ |
| | | time required for entire surface curing | 20 min. | 20 min. | 12 min. | 10 min. | 10 min. |
| | laser engraving property | degree of adhesion of resin residues (plate surface tackiness) | x | ○○ | Δ | Δ | x |
| | | halftone dot shape | ○ | ○ | ○ | ○ | ○ |
| | | 150 lpi, halftone dot formability | 1% | 1% | 1% | 1% | 1% |
| | | 175 lpi, halftone dot formability | 1% | 1% | 1% | 1% | 1% |

TABLE 2-continued

| | | | Comparative Examples | | | |
|---|---|---|---|---|---|---|
| | | | 6 | 7 | 8 | 9 |
| printability | ink laydown | | ○ | ○ | ○ | ○ |
| | printing durability | | ○ | ○ | ○ | ○ |
| Composition of photosensitive resin layer | water-dispersible latex | polybutadiene rubber 1 | 38.0 | 38.0 | | |
| | | poly(nitrile-butadiene) rubber | 11.0 | 11.0 | | |
| | | poly(styrene-butadiene) rubber 1 | | | 39 | 39 |
| | | polybutadiene rubber 2 | | | | |
| | | poly(styrene-butadiene) rubber 2 | | | 4.0 | 4.0 |
| | photopolymerizable unsaturated compound | oligo(butadiene acrylate) | 19.0 | 19.0 | 19.0 | 19.0 |
| | | lauryl methacrylate | 7.5 | 7.5 | 7.5 | 7.5 |
| | | trimethylolpropane triacrylate | 7.5 | 7.5 | 7.5 | 7.5 |
| | photopolymerization initiator | Irgacure 651 | 1.0 | 1.0 | 1.0 | 1.0 |
| | hydrophilic polymer | PFT-3 | 5.0 | 5.0 | 9.0 | 9.0 |
| | plasticizer | butadiene oligomer | 7.9 | 7.9 | 9.9 | 9.9 |
| | heat stabilizer | 4-methoxyphenol | 0.1 | 0.1 | 0.1 | 0.1 |
| | silicone compound | X22 1660B-3 | | | | |
| | | amino-modified silicone compound (KF8012) | 3 | | 3 | |
| | | epoxy-modified silicone compound (KF1005) | | | | |
| | | phenyl-modified silicone compound (KF50-300) | | 3 | | 3 |
| | | unmodified silicone compound (KF96-500) | | | | |
| Evaluation | light scattering property | | x | ○○ | x | ○○ |
| | time required for entire surface curing | | 20 min. | 10 min. | 20 min. | 10 min. |
| | laser engraving property | degree of adhesion of resin residues (plate surface tackiness) | ○○ | Δ | ○○ | Δ |
| | | halftone dot shape | ○ | ○ | ○ | ○ |
| | | 150 lpi, halftone dot formability | 1% | 1% | 1% | 1% |
| | | 175 lpi, halftone dot formability | 1% | 1% | 1% | 1% |
| printability | | ink laydown | ○ | ○ | ○ | ○ |
| | | printing durability | ○ | ○ | ○ | ○ |

As can be seen from Tables 1 and 2, in all of Examples 1 to 16 satisfying the requirements of the present invention, the difference in refractive index between the water-dispersible latex and the silicone compound is small, and thus the light scattering rate is small. Therefore, in spite of the fact that the thickness of the molded product made of the photosensitive resin composition is as thick as 2.5 mm, the time required for entire surface curing of the molded product is short. In addition, the laser engraving property and the printability are excellent. On the other hand, in Comparative Examples 1, 2, 6, and 8 in which the difference in refractive index between the water-dispersible latex and the silicone compound is large, the time required for entire surface curing of the molded product is long, and thus the production efficiency is poor. In Comparative Examples 1, 3, 4, 7, and 9 using a silicone compound having no amino group in the molecule, adhesion of resin residues is conspicuous. In Comparative Example 5 in which no silicone compound is blended, the light scattering rate is low, but the adhesion of resin residues is remarkable.

INDUSTRIAL APPLICABILITY

The laser-engravable flexographic printing original plate of the present invention can contain a sufficient amount of a silicone compound having plate surface tackiness decreasing ability in a printing plate without causing a problem of an increase in time required for entire surface curing due to light scattering. Accordingly, the laser-engravable flexographic printing original plate of the present invention can dramatically improve the persistence of the ability to prevent adhesion of resin residues and enable high quality mass printing. Therefore, the present invention is extremely useful.

The invention claimed is:

1. A laser-engravable flexographic printing original plate obtained by irradiating a molded product made of a photosensitive resin composition with light so as to cross-link and cure the molded product, in which the photosensitive resin composition contains a water-dispersible latex, a photopolymerizable unsaturated compound, a photopolymerization initiator, and a silicone compound in a mixture, in which the water-dispersible latex is one or more latex rubbers selected from the group consisting of polybutadiene rubber and poly(nitrile-butadiene) rubber, and in which the silicone compound is a silicone compound having an amino group in the molecule and has a refractive index of 1.44 to 1.60.

2. A laser-engravable flexographic printing original plate obtained by irradiating a molded product made of a photosensitive resin composition with light so as to cross-link and cure the molded product, in which the photosensitive resin composition contains a water-dispersible latex, a photopolymerizable unsaturated compound, a photopolymerization initiator, and a silicone compound in a mixture, in which the water-dispersible latex is poly(styrene-butadiene) rubber, and in which the silicone compound is a silicone compound having an amino group in the molecule and has a refractive index of 1.47 to 1.63.

3. The laser-engravable flexographic printing original plate according to claim 1, in which the silicone compound is a silicone compound having an amino group and a group containing an aromatic ring in the molecule.

4. The laser-engravable flexographic printing original plate according to claim 3, in which an amino group equivalent in the silicone compound is 500 to 10,000 g/mol and an equivalent of the group containing an aromatic ring in the silicone compound is 20 to 1,000 g/mol.

5. The laser-engravable flexographic printing original plate according to claim 1, in which a number average molecular weight of the silicone compound is 500 to 50,000.

6. The laser-engravable flexographic printing original plate according to claim 1, in which a content of the silicone compound in the photosensitive resin composition is more than 1.0% by mass and not more than 10% by mass.

7. The laser-engravable flexographic printing original plate according to claim 1, in which a thickness of the molded product made of the photosensitive resin composition is 2.0 mm to 5.0 mm.

* * * * *